United States Patent
Wu et al.

(10) Patent No.: US 10,395,696 B1
(45) Date of Patent: Aug. 27, 2019

(54) DOUBLE DATA RATE MEMORY

(71) Applicant: APACER TECHNOLOGY INC., New Taipei (TW)

(72) Inventors: Yung-Chih Wu, New Taipei (TW); Rui-Cheng Lin, New Taipei (TW)

(73) Assignee: APACER TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/161,699

(22) Filed: Oct. 16, 2018

(30) Foreign Application Priority Data

Sep. 5, 2018  (TW) .............................. 107131156 A

(51) Int. Cl.
*G11C 5/04* (2006.01)
*G11C 7/10* (2006.01)
*G11C 5/02* (2006.01)

(52) U.S. Cl.
CPC ............... *G11C 5/04* (2013.01); *G11C 5/025* (2013.01); *G11C 7/1072* (2013.01); *G11C 2207/105* (2013.01)

(58) Field of Classification Search
CPC combination set(s) only.
See application file for complete search history.

(56) References Cited

U.S. PATENT DOCUMENTS

| | | | |
|---|---|---|---|
| 7,263,019 B2 * | 8/2007 | Nierle ...................... | G11C 5/04 365/221 |
| 8,819,356 B2 * | 8/2014 | Rajan ...................... | G06F 12/00 711/154 |
| 2005/0044302 A1 * | 2/2005 | Pauley ................... | G11C 5/066 711/1 |

OTHER PUBLICATIONS

Micron, DDR4 3DS SDRAM LRDIMM MTA144ASQ16G72LSZ—128GB, 2016 (Year: 2016).*
Btarunr, Asus DDR4 "Double Capacity DIMM Form-Factor a Workaround to Low DRAM Chip Densities," Tech Power Up, www.techpowerup.com, Sep. 26, 2018, retrieved on Jun. 24, 2019, <URL https://www.techpowerup.com/247949/asus-ddr4-double-capacity-dimm-form-factor-a-workaround-to-low-dram-chip-densities> (Year: 2018).*

* cited by examiner

*Primary Examiner* — Harry W Byrne
*Assistant Examiner* — R Lance Reidlinger
(74) *Attorney, Agent, or Firm* — Kirton McConkie; Evan R. Witt

(57) ABSTRACT

A double data rate memory includes a circuit board, a goldfinger connection interface, at least 16 first IC chips, at least 16 second IC chips, a first and a second read-only memory. The circuit board has a first surface, a second surface, a first region and a second region. The first IC chips are disposed on the first surface. The second IC chips are disposed on the second surface. The first read-only memory is connected with the first and the second IC chips disposed on the first region. The second read-only memory is connected with the first and the second IC chips disposed on the second region. 10 pins of the goldfinger connection interface are connected with the second read-only memory and the first and the second IC chips disposed on the second region to make them operate. At least 32 IC chips are effectively operated in single one memory.

13 Claims, 7 Drawing Sheets

US 10,395,696 B1

DOUBLE DATA RATE MEMORY

CROSS-REFERENCE TO RELATED APPLICATION

This application claims priority from Taiwan Patent Application No. 107131156, filed on Sep. 5, 2018, the entire contents of which are incorporated herein by reference for all purposes.

FIELD OF THE INVENTION

The present invention relates to a memory, and more particularly to a double data rate memory.

BACKGROUND OF THE INVENTION

In view of the current motherboard manufacturers in the market, the motherboard products are gradually designed towards high specification, high efficiency and low cost. Therefore, reducing the size of the motherboard has become the trend in the current motherboard market. The amount of the memory module slots is reduced from four slots to only two slots in the newer motherboards, which have become the mainstream products.

Please refer to FIG. 1. FIG. 1 schematically illustrates the front structural view of a memory of prior art. As shown in FIG. 1, the conventional memory 1 has 8 integrated circuit (IC) chips 11 disposed on a circuit board 10, or even each has 8 IC chips 11 on both side of the circuit board 10, in which the total amount of the IC chips 11 becomes 16, and the conventional memory 1 is so called a double-sided memory.

Since the above mainstream motherboards are all configured with two memory module slots, and the maximum amount of IC chips 11 that can be used in single one memory module slot is still limited to 16 under current technology, it is almost impossible to further expand under the definition of old memory specifications. There exists at least one-time difference of the IC chips that can be used between the motherboards having two memory module slots and the motherboards having four memory module slots.

Therefore, there is a need of providing an improved double data rate memory distinct from the prior art in order to solve the above drawbacks.

SUMMARY OF THE INVENTION

Some embodiments of the present invention are to provide a double data rate memory in order to overcome at least one of the above-mentioned drawbacks encountered by the prior arts.

The present invention provides a double data rate memory. Since the double data rate memory is configured with at least 32 integrated circuit chips and at least two read-only memories, and the definitions of standard pins defined by JEDEC are changed as the pin definitions with at least double capacity utilized by the present disclosure, the lack of the specification of an old double data rate synchronous dynamic random access memory (DDR SDRAM) is solved. The advantages of making at least 32 integrated circuit chips effectively operate in single one double data rate synchronous dynamic random access memory are achieved.

In accordance with an aspect of the present invention, there is provided a double data rate memory. The double data rate memory includes a circuit board, a goldfinger connection interface, at least 16 first integrated circuit chips, at least 16 second integrated circuit chips, a first read-only memory and a second read-only memory. The circuit board has a first surface, a second surface, a first region and a second region. The goldfinger connection interface is disposed on a first side edge of the first region and is simultaneously disposed on the first surface and the second surface. The goldfinger connection interface has a plurality of pins. The at least 16 first integrated circuit chips are disposed on the first surface. A portion of the first integrated circuit chips are disposed on the first region, and rest of the first integrated circuit chips are disposed on the second region. The at least 16 second integrated circuit chips are disposed on the second surface. A portion of the second integrated circuit chips are disposed on the first region, and rest of the second integrated circuit chips are disposed on the second region. The first read-only memory is connected with the first integrated circuit chips disposed on the first region and the second integrated circuit chips disposed on the first region. The second read-only memory is connected with the first integrated circuit chips disposed on the second region and the second integrated circuit chips disposed on the second region. The first region has a second side edge. The second side edge and the first side edge are disposed on two opposite sides of the first region. The second region is disposed adjacent to the second side edge. 10 pins of the plurality of pins are connected with the second read-only memory and the first integrated circuit chips and the second integrated circuit chips disposed on the second region, thereby making the first integrated circuit chips and the second integrated circuit chips disposed on the second region operate.

In accordance with another aspect of the present invention, there is provided a double data rate memory. The double data rate memory includes a circuit board, a goldfinger connection interface, a plurality of integrated circuit chips and a plurality of read-only memories. The goldfinger connection interface is disposed on the circuit board. The goldfinger connection interface has a plurality of pins. The integrated circuit chips are disposed on a first surface of the circuit board. The amount of the plurality of integrated circuit chips is $2^n$, and n is larger than or equal to 4. The read-only memories are disposed on the circuit board. Each read-only memories is connected with 16 integrated circuit chips of the plurality of integrated circuit chips, the amount of the plurality of integrated circuit chips is $2^{n-4}$, and x pins of the plurality of pins are connected with the plurality of read-only memories and the plurality of integrated circuit chips, thereby making the read-only memories and the integrated circuit chips operate, and wherein $x=10(2^{n-4})$.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
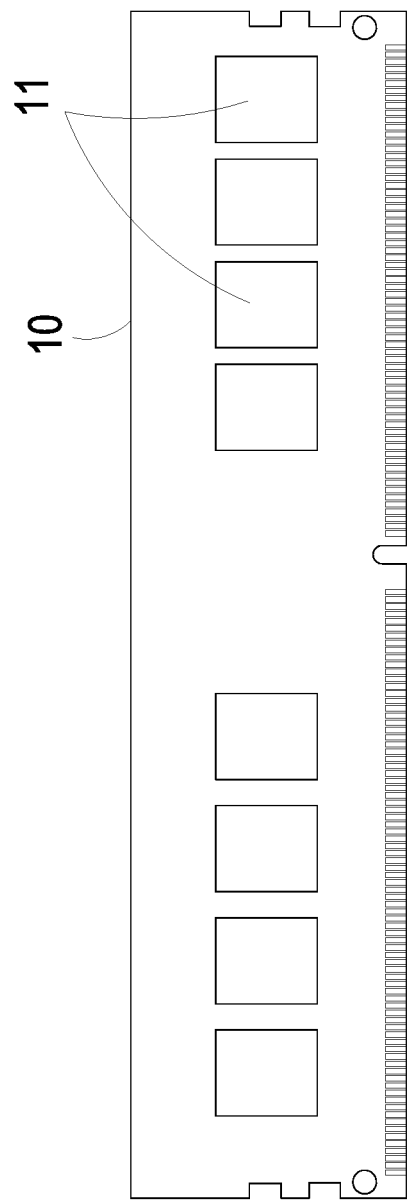
FIG. 1 schematically illustrates the front structural view of a memory of prior art.
Figure 2:
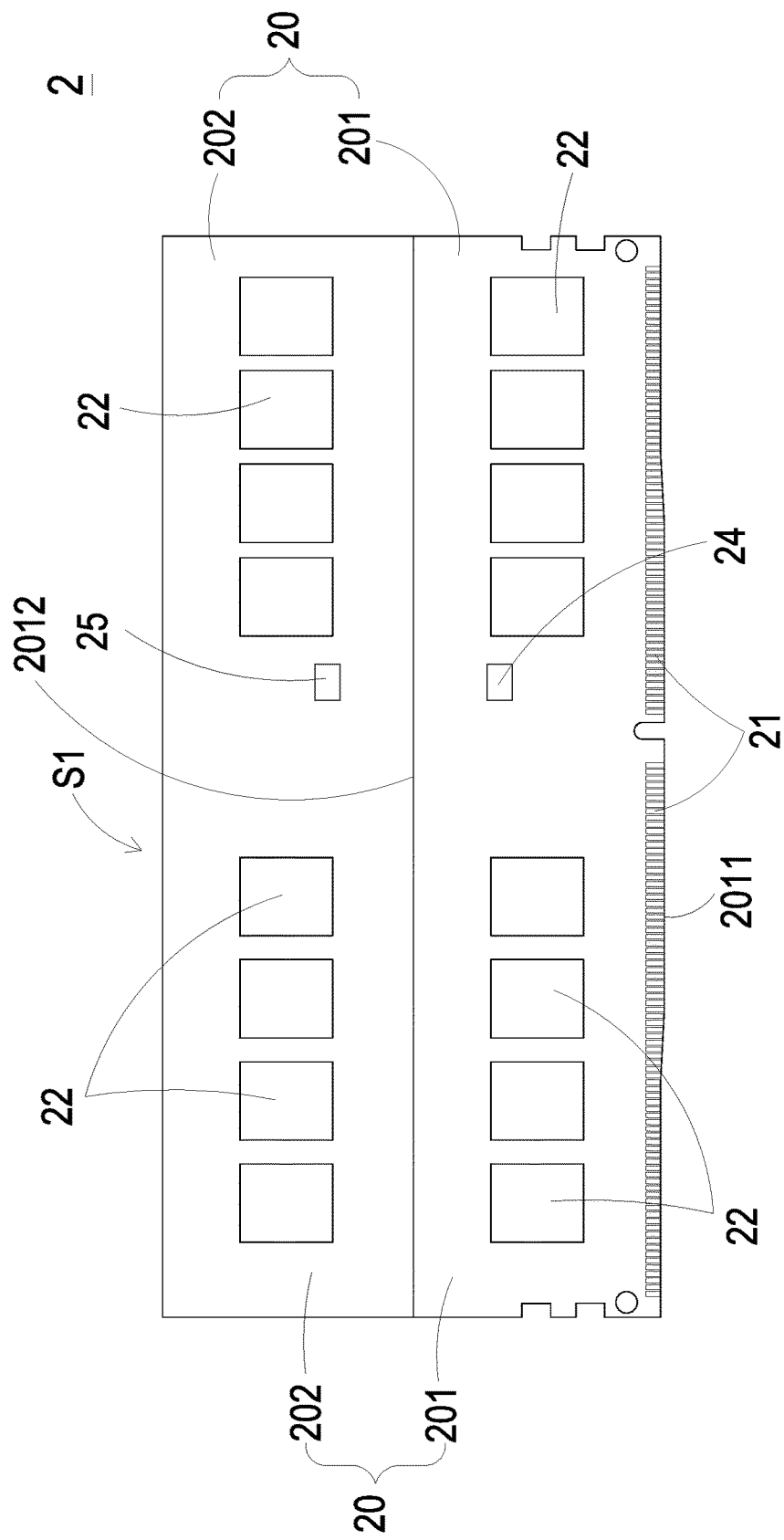
FIG. 2 schematically illustrates the front view of a double data rate memory according to an embodiment of the present invention.
Figure 3:
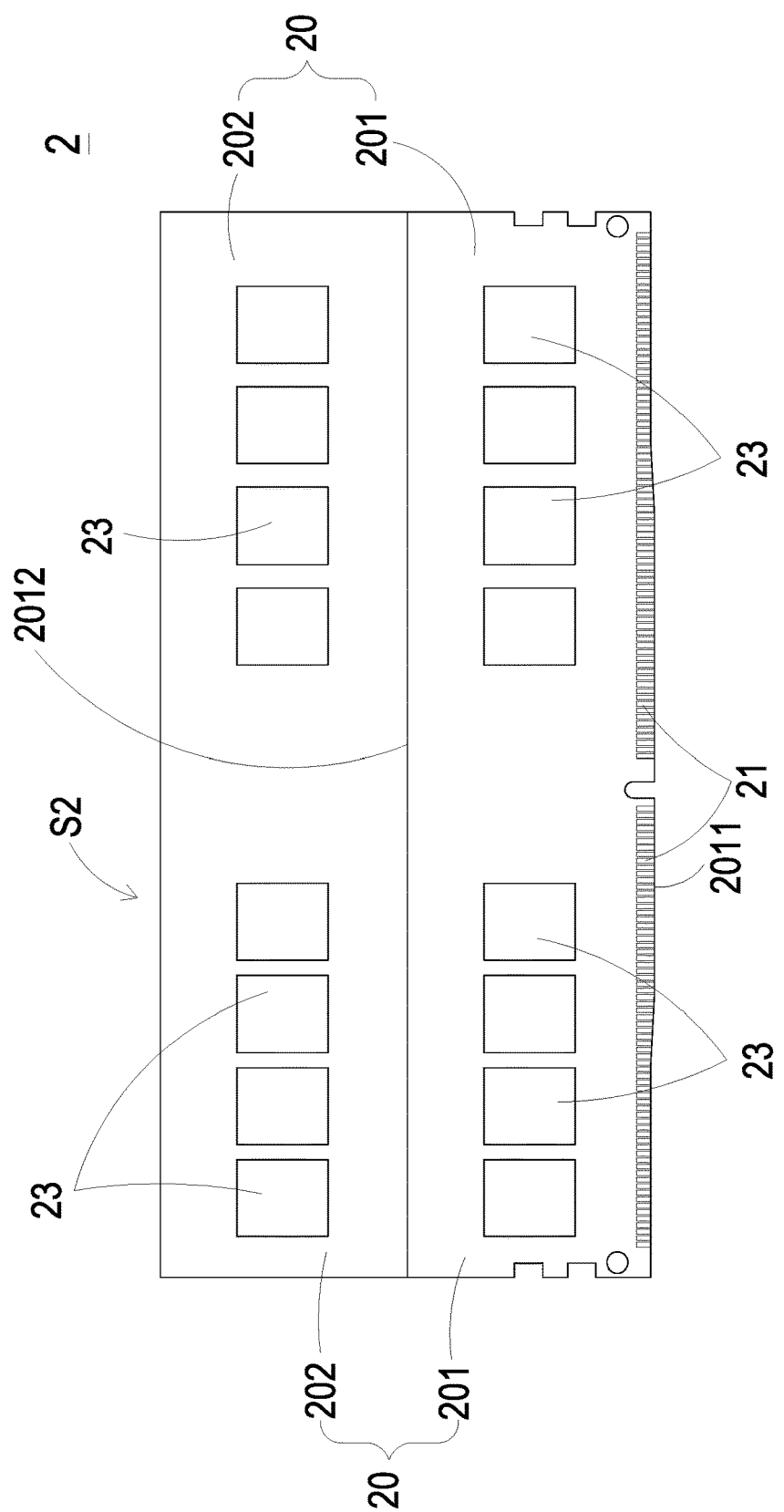
FIG. 3 schematically illustrates the rear view of the double data rate memory shown in FIG. 2.

Please refer to FIG. 2 and FIG. 3. FIG. 2 schematically illustrates the front view of a double data rate memory according to an embodiment of the present invention. FIG. 3 schematically illustrates the rear view of the double data rate memory shown in FIG. 2. As shown in FIG. 2 and FIG. 3, a double data rate memory 2 of the present invention includes a circuit board 20, a goldfinger connection interface 21, at least 16 first integrated circuit (IC) chips 22, at least 16 second integrated circuit chips 23, a first read-only memory 24 and a second read-only memory 25. The double data rate memory 2 is a double data rate fourth generation synchronous dynamic random access memory (DDR4 SDRAM), and the double data rate fourth generation synchronous dynamic random access memory has none of a registered integrated circuit. This type of DDR4 SDRAM is called "Unbuffered-DIMM DDR4 SDRAM". In other words, the circuit board 20, the goldfinger connection interface 21, the first integrated circuit chips 22, the second integrated circuit chips 23, the first read-only memory 24 and the second read-only memory 25 are configured as an unbuffered-DIMM DDR4 SDRAM, but not limited thereto.

The circuit board 20 has a first surface S1 and a second surface S2. The first surface S1 and the second surface S2 are respectively the front surface and the rear surface of the circuit board 20, but not limited thereto. In addition, the circuit board 20 has a first region 201 and a second region 202. The first region 201 has a first side edge 2011 and a second side edge 2012. The second side edge 2012 and the first side edge 2011 are disposed on two opposite sides of the first region 201. The second region 202 is disposed adjacent to the second side edge 2012. The goldfinger connection interface 21 is disposed on the circuit board 20, and is specifically disposed on the first side edge 2011 of the first region 201 and is simultaneously disposed on the first surface S1 and the second surface S2. The goldfinger connection interface 21 has a plurality of pins. In other words, if the position where the goldfinger connection interface 21 is disposed is considered as the bottom of the circuit board 20, the first region 201 is positioned at the bottom of the circuit board 20, and the second region 202 is positioned at the top of the circuit board 20.

The at least 16 first integrated circuit chips 22 are disposed on the first surface S1. A portion of the first integrated circuit chips 22 are disposed on the first region 201, and rest of the first integrated circuit chips 22 are disposed on the second region 202. For example, half the at least 16 first integrated circuit chips 22 (i.e. at least 8 first IC chips 22) are disposed on the first region 201, and the other half the at least 16 first integrated circuit chips are disposed on the second region 202. The distribution of the at least 16 first integrated circuit chips 22 is not limited herein. On the other hand, the at least 16 second integrated circuit chips 23 are disposed on the second surface S2. A portion of the second integrated circuit chips 23 are disposed on the first region 201, and rest of the second integrated circuit chips 23 are disposed on the second region 202. For example, half the at least 16 second integrated circuit chips 23 (i.e. at least 8 second IC chips 23) are disposed on the first region 201, and the other half the at least 16 second integrated circuit chips 23 are disposed on the second region 202. The distribution of the at least 16 second integrated circuit chips 23 is not limited herein.

The first read-only memory 24 is connected with the first integrated circuit chips 22 disposed on the first region 201 and the second integrated circuit chips 23 disposed on the first region 201. The second read-only memory 25 is connected with the first integrated circuit chips 22 disposed on the second region 202 and the second integrated circuit chips 23 disposed on the second region 202. In some embodiments, the first read-only memory 24 and the second read-only memory 25 are preferred to be electrically-erasable programmable read-only memories (EEPROM), but not limited herein. Furthermore, at least 10 pins of the plurality of pins of the goldfinger connection interface 21 are electrically connected with the second read-only memory 25 and the first integrated circuit chips 22 disposed on the second region 202 and the second integrated circuit chips 23 disposed on the second region 202, thereby making the first integrated circuit chips 22 and the second integrated circuit chips 23 disposed on the second region 202 operate and work.

Meanwhile, some pins of the rest pins of the plurality of pins are electrically connected with the first read-only memory 24 and the first integrated circuit chips 22 and the second integrated circuit chips 23 disposed on the first region 201. The definitions of the pins follow the standard specification defined by Joint Electron Device Engineering Council (JEDEC), so they are not redundantly described herein. In the present invention, at least 10 pins mentioned above are changed as the pin definitions with at least double capacity utilized by the present invention. The detail will be described in following paragraphs. From the above embodiments, by disposing at least 32 IC chips (including the first IC chips 22 and the second IC chips 23), the definitions of standard pins defined by JEDEC are changed as the pin definitions with at least double capacity utilized by the present disclosure, the lack of the specification of an old double data rate synchronous dynamic random access memory is solved. The advantages of making at least 32 integrated circuit chips effectively operate in single one double data rate synchronous dynamic random access memory are achieved.

In some embodiments, the first read-only memory 24 is disposed on the first surface S1, and the second read-only memory 25 is disposed on the first surface S1. In addition, the first read-only memory 24 is disposed on the first region 201, and the second read-only memory 25 is disposed on the second region 202. Certainly, the first read-only memory 24 and the second read-only memory 25 each can be disposed on the first surface S1 or the second surface S2, and the first region 201 or the second region 202, for meeting the practical demands or according to the circuit layout. In some embodiments, each of the first integrated circuit chips 22 is symmetric with one of the at least 16 integrated circuit chips 23 on the circuit board 20, but not limited thereto.

In some embodiments, since the double data rate memory 2 is a DDR4 SDRAM following the specification defined by JEDEC, the amount of the plurality of pins of the goldfinger connection interface 21 is 288. Because there exist many unused pins (or may be unused pins) in the definitions of the standard pins defined by JEDEC (i.e. the "NC" pins), the present invention utilizes at least 10 pins with definitions including "NC" to provide the operations of the second read-only memory 25 and the first integrated circuit chips 22 and the second integrated circuit chips 23 disposed on the second region 202. The definitions of the 10 pins include two clock enable (CKE) signal pins, two differential clock inputs of positive edge (CLK) signal pins, two differential clock inputs of negative edge (CLK#) signal pins, two chip select (CS) signal pins and two on die termination (ODT) signal pins. According to the definitions defined by JEDEC, the at least 10 pins providing the operations of the first read-only memory 24 and the first integrated circuit chips 22 and the second integrated circuit chips 23 disposed on the first region 201 are CKE_0, CKE_1, CLK_0, CLK_1, CLK#0, CLK#1, CS#0, CS#1, ODT_0 and ODT_1. The 10 pins with definitions including "NC" are changed as the exclusive definitions of the pins of the goldfinger connection interface 21 of the double data rate memory 2 to provide the operations of the second read-only memory 25 and the first integrated circuit chips 22 and the second integrated circuit chips 23 disposed on the second region 202. The 10 pins herein are CKE_2, CKE_3, CLK_2, CLK_3, CLK#2, CLK#3, CS#2, CS#3, ODT_2 and ODT_3.

For example, the two clock enable signal pins (i.e. CKE_2 and CKE_3) are the 49th and the 194th pins of the 288 pins, the two differential clock inputs of positive edge signal pins (i.e. CLK_2 and CLK_3) are the 56th and 54th pins of the 288 pins, the two differential clock inputs of negative edge signal pins (i.e. CLK#2 and CLK#3) are the 201st and 199th pins of the 288 pins, the two chip select (i.e. CS#2 and CS#3) signal pins are the 227th and 235th pins of the 288 pins, and the two on die termination (i.e. ODT_2 and ODT_3) signal pins are the 230th and 237th pins of the 288 pins. It should be noted that the number and the order of the 10 pins that can be applied are not limited herein.

It is worthy to note that the 10 pins providing the operations of the first read-only memory 24 and the first integrated circuit chips 22 and the second integrated circuit chips 23 disposed on the first region 201 are preferred to provide the operations of a first read-only memory 24 and a total amount equal to 16 of the integrated circuit chips, and the 10 pins providing the operations of the second read-only memory 25 and the first integrated circuit chips 22 and the second integrated circuit chips 23 disposed on the second region 202 are preferred to provide the operations of a second read-only memory 25 and a total amount equal to 16 of the integrated circuit chips. In other words, the cooperation of each read-only memory and 16 integrated circuit chips is preferred to be worked with 10 pins. In this embodiment, compared with prior art, extra 10 pins with definitions including "NC" are utilized and changed to meet the requirements of an extra combination of one read-only memory and 16 integrated circuit chips. If another combination is going to be applied in an embodiment, each combination of one read-only memory and 16 integrated circuit chips needs extra 10 pins with definitions including "NC".

Figure 4:
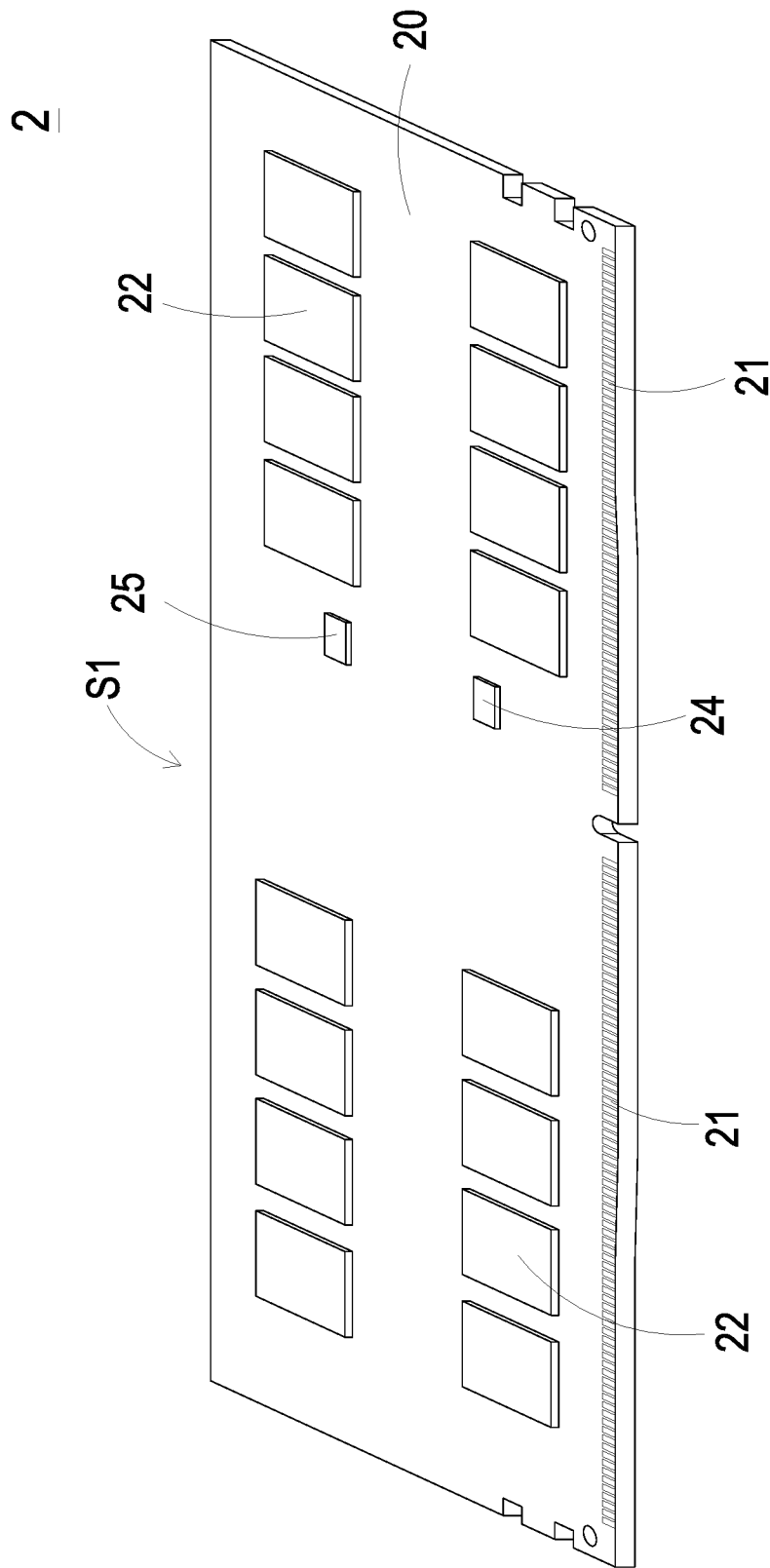
FIG. 4 schematically illustrates the structure of a double data rate memory according to an embodiment of the present invention.
Figure 5:
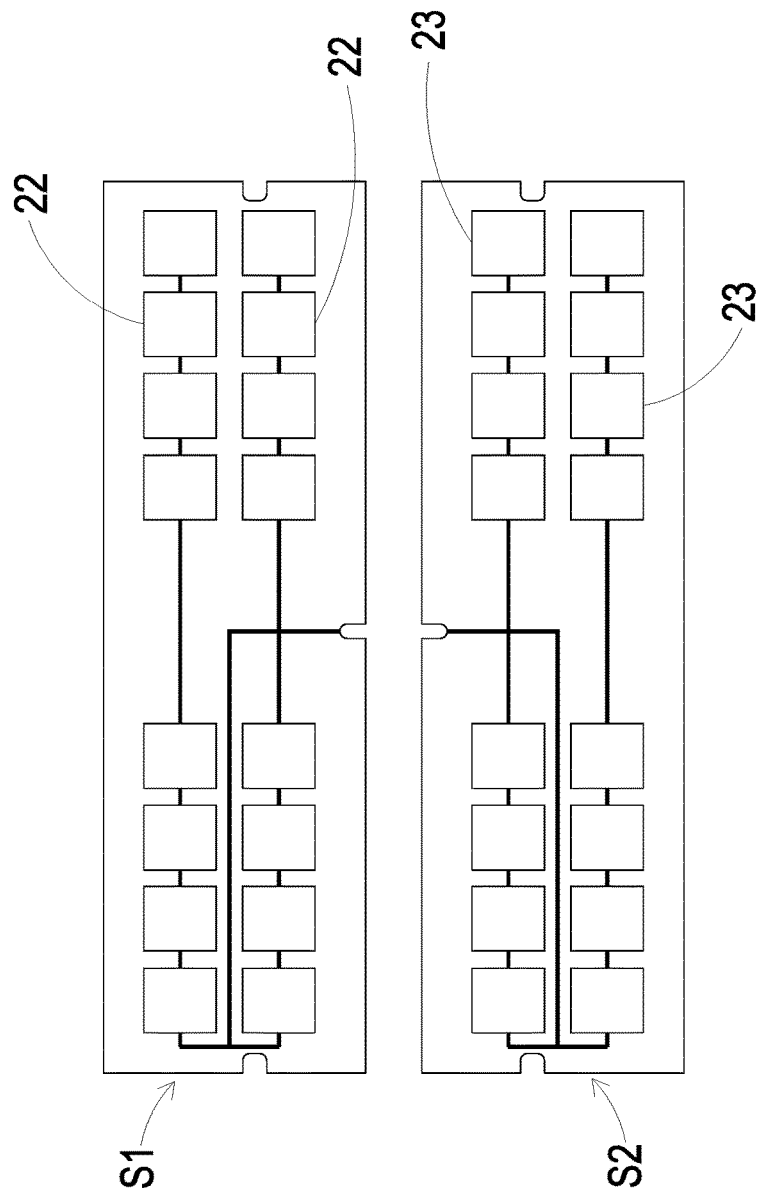
FIG. 5 schematically illustrates the configuration of the double data rate memory shown in FIG. 4.

Please refer to FIG. 4 and FIG. 5. FIG. 4 schematically illustrates the structure of a double data rate memory according to an embodiment of the present invention. FIG. 5 schematically illustrates the configuration of the double data rate memory shown in FIG. 4. As shown in FIG. 4 and FIG. 5, the circuit board 20 of the double data rate memory 2 of the present invention can be one-piece formed or integrally formed, in which the first region 201 and the second region 202 practically have no seam or division therebetween. The first region 201 and the second region 202 are defined to clearly describe the distribution of the goldfinger connection interface 21, the first integrated circuit chips 22, the second integrated circuit chips 23, the first read-only memory 24 and the second read-only memory 25. As shown in FIG. 5, every 8 first integrated circuit chips 22 are serially connected as a rank of memory chip, every 8 second integrated circuit chips 23 are serially connected as another rank of memory chip, and the ranks of memory chip are connected in parallel and crossed over the first surface S1 and the second surface S2 through the circuit of the circuit board 20. A rank of memory chip represents a plurality of integrated circuit chips linked to the same chip select. The double data rate memory 2 of the present invention includes at least 32 IC chips and at least 4 ranks of memory as shown in FIG. 5.

Figure 6:
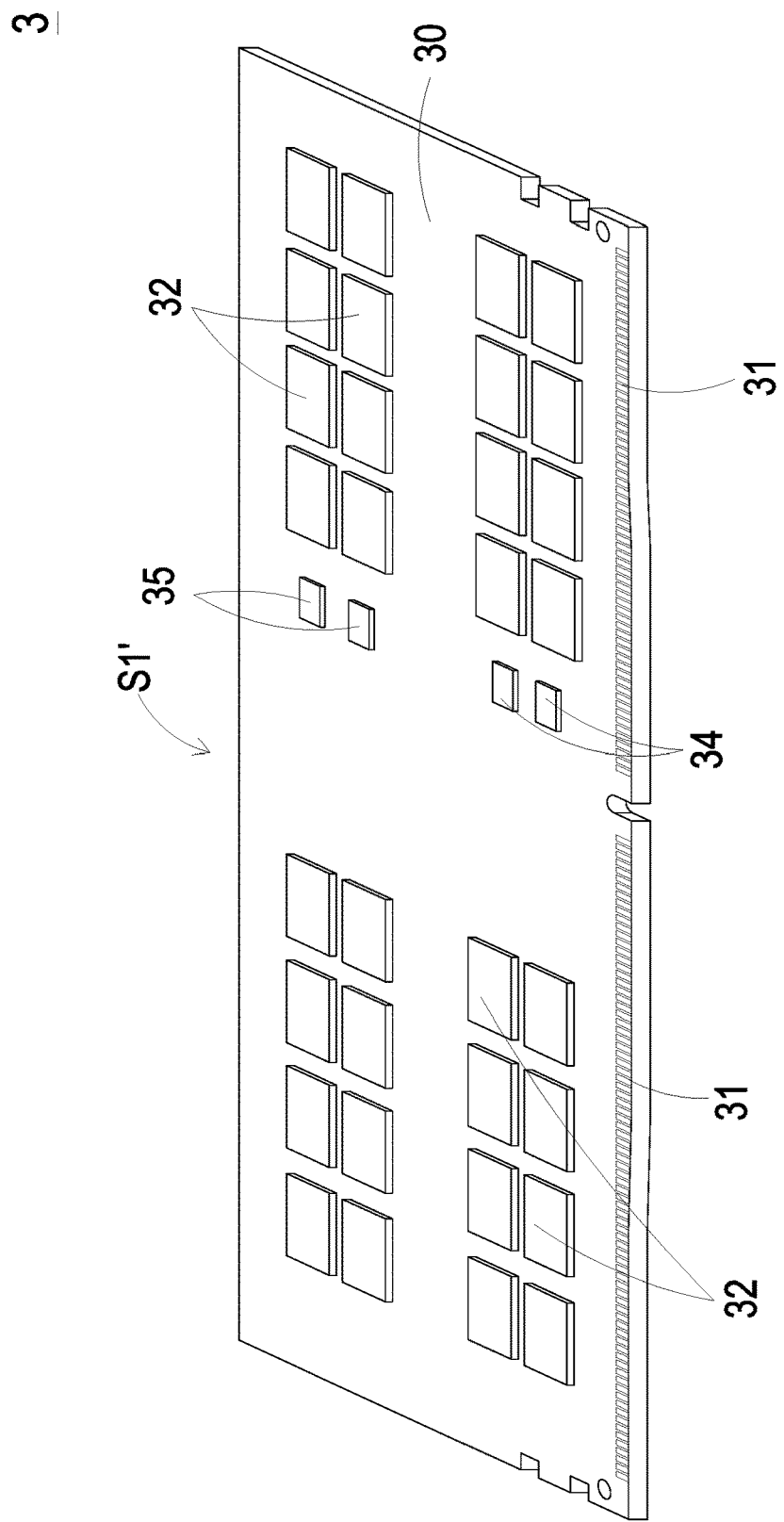
FIG. 6 schematically illustrates the structure of a double data rate memory according to another embodiment of the present invention.
Figure 7:
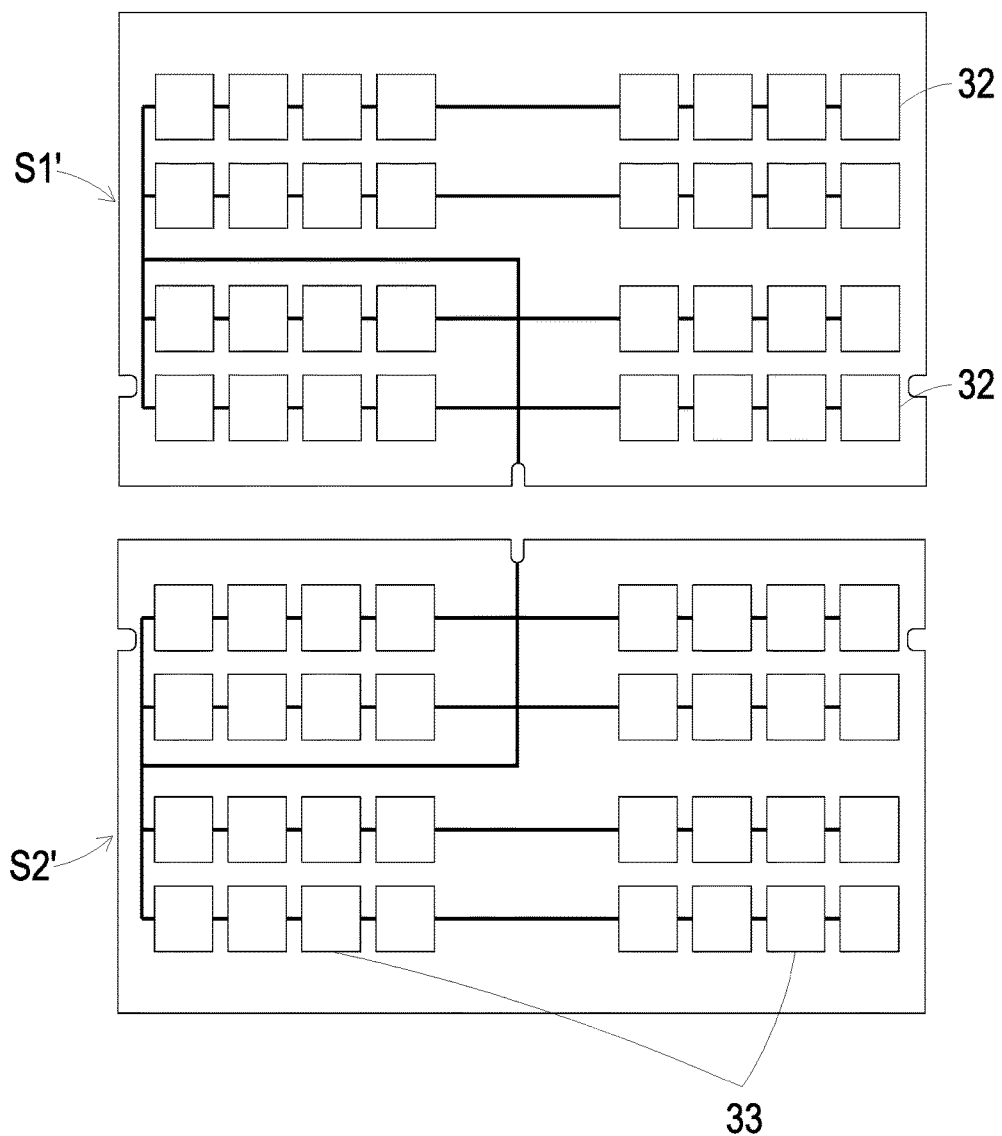
FIG. 7 schematically illustrates the configuration of the double data rate memory shown in FIG. 6.

Please refer to FIG. 6 and FIG. 7. FIG. 6 schematically illustrates the structure of a double data rate memory according to another embodiment of the present invention. FIG. 7 schematically illustrates the configuration of the double data rate memory shown in FIG. 6. As shown in FIG. 6 and FIG. 7, a double data rate memory 3 according to another embodiment of the present invention includes a circuit board 30, a goldfinger connection interface 31, 32 first integrated circuit chips 32, 32 second integrated circuit chips 33, a first read-only memory 34 and a second read-only memory 35. The difference between this embodiment and the above-mentioned embodiments is that the amount of the first integrated circuit chips herein is 32, and the amount of the second integrated circuit chips herein is also 32. That is, the double data rate memory 3 of this embodiment is a DDR4 SDRAM including 64 IC chips. In other words, the circuit board 30, the goldfinger connection interface 31, the first integrated circuit chips 32, the second integrated circuit chips 33, the first read-only memory 34 and the second read-only memory 35 are configured as an unbuffered-DIMM DDR4 SDRAM, but not limited thereto. In some embodiments, based on the present structure of memories, a read-only memory (e.g. an EEPROM) has the best efficiency while cooperating with 16 IC chips. In this embodiments, the double data rate memory 3 is preferred to include 2 first read-only memory 34 and 2 second read-only memory 35, but not limited thereto.

Since the other parts of the embodiments are similar with the embodiments mentioned above, it is not redundantly described herein. In addition, as shown in FIG. 7, every 8 first integrated circuit chips 32 are serially connected as a rank of memory chip, every 8 second integrated circuit chips 33 are serially connected as another rank of memory chip, and the ranks of memory chip are connected in parallel and crossed over the first surface S1' and the second surface S2' through the circuit of the circuit board 30. The double data rate memory 3 of the present invention includes at least 64 IC chips and at least 8 ranks of memory as shown in FIG. 5.

Please refer to FIG. 6 again. In some embodiments, the integrated circuit chips may be disposed only on the first surface S1'. For example, the double data rate memory shown in FIG. 6 can be considered as a double data rate memory including 32 integrated circuit chips all disposed on the first surface S1' of the circuit board 30, but not limited herein.

It can be known through the above-mentioned embodiments that in the double data rate memory of the present invention, the sum of the total amounts of the first integrated circuit chips and the second integrated circuit chips, which is the total amount of the integrated circuit chips disposed on the circuit board, equals to $2^n$, in which n is greater than or equal to 4. That is, the total amount of the integrated circuit chips disposed on the circuit board is 16, 32, 64, 128, . . . , etc., and the integrated circuit chips can be disposed on the first surface and/or the second surface of the circuit board for meeting the demands. Additionally, the sum of the total amounts of the first read-only memories and the second read-only memories, which is the total amount of the read-only memories disposed on the circuit board, equals to $2^{n-4}$, in which n is greater than or equal to 4. That is, the total amount of the read-only memories disposed on the circuit board is 1, 2, 4, 8, . . . , etc. Meanwhile, the total amount of pins providing the operations of all read-only memories and all integrated circuit chips (i.e. the clock enable signal pins, the differential clock inputs of positive edge signal pins, the differential clock inputs of negative edge signal pins, the chip select signal pins and the on die termination signal pins) is ten times of the total amount of the read-only memories, which is written by $10(2^{n-4})$. In particular, a definition of each pin of the pins is a clock enable signal pin, a differential clock input of positive edge signal pin, a differential clock input of negative edge signal pin, a chip select signal pin, or an on die termination signal pin. The total amount of pins providing the operations of all read-only memories and all integrated circuit chips is 10, 20, 40, 80, . . . , etc. Compared with the definitions defined by JEDEC, extra 0, 10, 30, 70, . . . pins are changed as the exclusive definitions of the pins of the double data rate memory of the present invention.

From the above discussion, the present invention provides a double data rate memory. Since the double data rate memory is configured with at least 32 integrated circuit chips and at least two read-only memories, and the definitions of standard pins defined by JEDEC are changed as the pin definitions with at least double capacity utilized by the present disclosure, the lack of the specification of an old double data rate synchronous dynamic random access memory (DDR SDRAM) is solved. The advantages of making at least 32 integrated circuit chips effectively operate in single one double data rate synchronous dynamic random access memory are achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A double data rate memory, comprising:
a circuit board having a first surface, a second surface, a first region and a second region;
a goldfinger connection interface disposed on a first side edge of the first region and simultaneously disposed on the first surface and the second surface, wherein the goldfinger connection interface has a plurality of pins;
at least 16 first integrated circuit chips disposed on the first surface, wherein a portion of the first integrated circuit chips are disposed on the first region, and rest of the first integrated circuit chips are disposed on the second region;
at least 16 second integrated circuit chips disposed on the second surface, wherein a portion of the second integrated circuit chips are disposed on the first region, and rest of the second integrated circuit chips are disposed on the second region;
a first read-only memory connected with the first integrated circuit chips disposed on the first region and the second integrated circuit chips disposed on the first region; and
a second read-only memory connected with the first integrated circuit chips disposed on the second region and the second integrated circuit chips disposed on the second region,
wherein the first region has a second side edge, the second side edge and the first side edge are disposed on two opposite sides of the first region, the second region is disposed adjacent to the second side edge, and 10 pins of the plurality of pins are electrically connected with the second read-only memory and the first integrated circuit chips and the second integrated circuit chips disposed on the second region, thereby making the first integrated circuit chips and the second integrated circuit chips disposed on the second region operate.

2. The double data rate memory according to claim 1, wherein the first read-only memory is disposed on the first surface, and the second read-only memory is disposed on the first surface.

3. The double data rate memory according to claim 1, wherein the first read-only memory is disposed on the first region, and the second read-only memory is disposed on the second region.

4. The double data rate memory according to claim 1, wherein the first read-only memory and the second read-only memory are electrically-erasable programmable read-only memories.

5. The double data rate memory according to claim 1, wherein half the at least 16 first integrated circuit chips are disposed on the first region, the other half the at least 16 first integrated circuit chips are disposed on the second region, half the at least 16 second integrated circuit chips are disposed on the first region, and the other half the at least 16 second integrated circuit chips are disposed on the second region.

6. The double data rate memory according to claim 5, wherein each of the first integrated circuit chips is symmetric with one of the at least 16 integrated circuit chips on the circuit board.

7. The double data rate memory according to claim 1, wherein the amount of the plurality of pins is 288.

8. The double data rate memory according to claim 7, wherein definitions of the 10 pins connected with the second read-only memory and the first integrated circuit chips and the second integrated circuit chips disposed on the second region comprise two clock enable signal pins, two differential clock inputs of positive edge signal pins, two differential clock inputs of negative edge signal pins, two chip select signal pins and two on die termination signal pins.

9. The double data rate memory according to claim 8, wherein the two clock enable signal pins are the $49^{th}$ and the $194^{th}$ pins of the 288 pins, the two differential clock inputs of positive edge signal pins are the $56^{th}$ and $54^{th}$ pins of the 288 pins, the two differential clock inputs of negative edge signal pins are the $201^{st}$ and $199^{th}$ pins of the 288 pins, the two chip select signal pins are the $227^{th}$ and $235^{th}$ pins of the 288 pins, and the two on die termination signal pins are the $230^{th}$ and $237^{th}$ pins of the 288 pins.

10. The double data rate memory according to claim 1, wherein the double data rate memory is a double data rate fourth generation synchronous dynamic random access memory, and the double data rate fourth generation synchronous dynamic random access memory has none of a registered integrated circuit.

11. A double data rate memory, comprising:
a circuit board;
a goldfinger connection interface disposed on the circuit board, wherein the goldfinger connection interface has a plurality of pins;
a plurality of integrated circuit chips disposed on a first surface of the circuit board, wherein the amount of the plurality of integrated circuit chips is $2^n$, and n is larger than or equal to 4; and
a plurality of read-only memories disposed on the circuit board, wherein each of the read-only memories is connected with 16 integrated circuit chips of the plurality of integrated circuit chips, and the amount of the plurality of integrated circuit chips is $2^{n-4}$,
wherein x pins of the plurality of pins are connected with the plurality of read-only memories and the plurality of integrated circuit chips, thereby making the read-only memories and the integrated circuit chips operate, and wherein $X=10(2^{n-4})$.

12. The double data rate memory according to claim 11, wherein a definition of each pin of the x pins is a clock enable signal pin, a differential clock input of positive edge signal pin, a differential clock input of negative edge signal pin, a chip select signal pin, or an on die termination signal pin.

13. The double data rate memory according to claim 11, wherein the double data rate memory is a double data rate fourth generation synchronous dynamic random access memory, and the double data rate fourth generation synchronous dynamic random access memory has none of a registered integrated circuit.

* * * * *